(12) United States Patent
Mabed et al.

(10) Patent No.: US 12,484,196 B2
(45) Date of Patent: Nov. 25, 2025

(54) OPTIMIZED STRUCTURE FOR REGULATING HEAT VIA HEAT PIPE FOR ELECTRONIC EQUIPMENT SUPPORT PANELS

(71) Applicant: SONACA S.A., Gosselies (BE)

(72) Inventors: Barbara Mabed, Gosselies (BE); Marc Bekemans, Charleroi (BE)

(73) Assignee: SONACA S.A., Gosselies (BE)

( * ) Notice: Subject to any disclaimer, the term of this patent is extended or adjusted under 35 U.S.C. 154(b) by 265 days.

(21) Appl. No.: 18/564,970

(22) PCT Filed: May 31, 2022

(86) PCT No.: PCT/EP2022/064768
§ 371 (c)(1),
(2) Date: Nov. 28, 2023

(87) PCT Pub. No.: WO2022/253837
PCT Pub. Date: Dec. 8, 2022

(65) Prior Publication Data
US 2024/0239521 A1 Jul. 18, 2024

(30) Foreign Application Priority Data
May 31, 2021 (BE) .................................. 2021/5435

(51) Int. Cl.
*H05K 7/20* (2006.01)
*B64G 1/64* (2006.01)
*B64G 1/50* (2006.01)

(52) U.S. Cl.
CPC ......... *H05K 7/20336* (2013.01); *B64G 1/641* (2013.01); *B64G 1/506* (2013.01)

(58) Field of Classification Search
None
See application file for complete search history.

(56) References Cited

U.S. PATENT DOCUMENTS

| 4,388,964 A | 6/1983 | Almgren et al. |
| 5,682,943 A * | 11/1997 | Yao .......................... B64G 1/58 165/104.21 |
| 9,238,513 B2 * | 1/2016 | Aston .................... B64G 1/506 |
| 10,225,953 B2 * | 3/2019 | Gernert ............... H01L 23/3733 |
| 2003/0196778 A1 | 10/2003 | Kobayashi et al. |

(Continued)

FOREIGN PATENT DOCUMENTS

| FR | 2951695 A1 * | 4/2011 | ............. B32B 3/263 |
| JP | S6383586 A | 4/1988 | |

OTHER PUBLICATIONS

FR 2951695 A1 English translation (Year: 2011).*

(Continued)

*Primary Examiner* — Mukundbhai G Patel
(74) *Attorney, Agent, or Firm* — McDonald Hopkins LLC

(57) ABSTRACT

A profile section for an equipment support panel. The profile section is formed in one piece, comprising a tube suitable for forming a heat pipe by introducing and confining a heat-transfer fluid inside of same, and a groove provided to form a rail along its length for securing at least one piece of equipment supported by the panel, this groove being shaped to form-fittingly engage with an attachment member rigidly connected to the at least one piece of equipment.

7 Claims, 3 Drawing Sheets

(56) References Cited

U.S. PATENT DOCUMENTS

2011/0095572 A1     4/2011   Wary
2015/0013941 A1*   1/2015   Wong ................. H05K 7/20336
                                                                         165/104.21

OTHER PUBLICATIONS

Search Report for International Application No. PCT/EP2022/064768 dated Sep. 26, 2022.
Written Opinion for International Application No. PCT/EP2022/064768 dated Sep. 26, 2022.

* cited by examiner

OPTIMIZED STRUCTURE FOR REGULATING HEAT VIA HEAT PIPE FOR ELECTRONIC EQUIPMENT SUPPORT PANELS

CROSS-REFERENCE TO RELATED APPLICATIONS

This is the National Stage application of PCT international application PCT/EP2022/064768, filed on May 31, 2022, which claims the priority of Belgium Patent Application No. 2021/5435, filed May 31, 2021, both of which are incorporated herein by reference in their entireties.

TECHNICAL FIELD

The present invention falls within the field of spacecraft, and relates more specifically to the problem of managing the heat emitted by electronic equipment on board this type of craft.

PRIOR ART

Spacecraft, such as telecommunication satellites or probes, include high-power electronic equipment disposed within a hermetic box delimited by structural panels. This equipment is carried by structural panels which are usually in the form of sandwich panels comprising two surface structures, or "skins", enclosing a core, for example a honeycomb core. This choice of panel construction is widely adopted by manufacturers because it combines high rigidity with minimal mass.

On-board electronic equipment generates significant amounts of heat. This heat must be dissipated towards the outside of the box to ensure a stable ambient temperature acceptable for the continuous operation of this electronic equipment. The outer space surrounding the satellite during its operational life being empty of air, in other words cooling by ventilation remaining impossible, it is a question of dissipating this emitted heat. In this regard, the solution mainly adopted consists in equipping the structural panels with passive heat pipe type temperature exchangers, the operation of which is based on the principle of phase transition of a material to absorb/release energy, according to the known principle of evaporation-condensation. In such an application, a heat pipe, marked by 1 in FIG. 1, is conventionally in the shape of a bar which is introduced into the centre of a panel 2, perpendicularly to the equipment 3 and in direct thermal contact with the two skins 4, 5. It delimits inside of same a hollow tube 7, sealed tightly at its two ends, which encapsulates a two-phase heat-transfer fluid. The heat-transfer fluid vaporizes near the equipment 3 by absorbing the heat stored by the skin 4 (hot source) on which the latter is mounted, called the internal skin. The fluid subsequently condenses at a distance from the equipment 3 to return to the liquid state by transferring thermal energy by diffusion to the external skin 5 (cold source) which is immersed in the cold outer space. In practice, given that gravity is essentially non-existent during the operating life of the spacecraft, longitudinal splines 8 are provided to protrude from the internal surface of the tube 7 radially inwards, and thus allow the circulation of the liquid and gas phases in either direction by capillarity.

One of the difficulties associated with the use of a sandwich panel lies in securing the equipment 3 perpendicularly to the heat pipe 1. Indeed, the honeycomb core 9 and the skins 4, 5, due to their low thickness, have insufficient mechanical properties to support a load concentrated at a point such as that caused by the direct introduction of a screw element. To guarantee good hold of the assembly, inserts 11 have therefore been developed to provide the interfacing between the sandwich panel and the securing means adopted, and thus distribute the local connection forces over a larger surface. These inserts 11 are placed in housings 12 formed by machining/drilling through the panel 2, at the precise equipment securing points. The insert 11 is "cold" glued or glued at low temperature by introducing a "potting" type glue 13 injected between the insert 11 and the honeycomb 9, before receiving a securing means such as a screw marked by 14.

In practice, using inserts requires respecting restricted tolerances of location, inclination and flush, which are often defined late during the design of the product in that it is a question of knowing precisely the location of destination of future electronic equipment, and, consequently, the location of heat pipes. In addition, visual inspection is not always possible, in particular in the case of an insert located in the middle of the panel, which requires the provision of samplers or the direct application of a load to the insert to check its good mechanical strength. Finally, it should be noted that an unexpected change in the location of equipment will result in a new drilling, risking penalising the overall mechanical resistance of the panel, or even the manufacture of a new panel if the equipment is too distant from a heat pipe.

Thus, the use of inserts generates a certain number of assembly constraints while being subject to delays and additional production costs.

The purpose of the invention is therefore to propose a solution for integrating electronic equipment which is both compatible with the use of heat-dissipating sandwich panels, and which at least partially resolves the identified disadvantages of the prior art.

DESCRIPTION OF THE INVENTION

To this end, the invention relates to an equipment support panel, the panel comprising at least one single-piece portion made by a profile section including:
- a tube suitable for forming a heat pipe by introducing and confining a heat-transfer fluid inside of same, and
- a groove provided to form a rail along its length for securing at least one piece of equipment intended to be supported by the panel, this groove being shaped to form-fittingly engage with an attachment member rigidly connected to said at least one piece of equipment,
- said panel including two skins, respectively internal and external skins, and wherein the profile section is installed between these two skins being delimited by a first face resting against the internal skin and a second face resting against the external skin, the groove of the profile section being formed to open at the first face and, additionally, a slot being formed continuous in the internal skin while being superimposed on the groove to allow the support and movement of equipment resting on the internal skin by engagement and sliding of the corresponding attachment member in the groove, through the slot.

With this solution, the disadvantages identified in the prior art are resolved, the use of the profile section according to the invention allowing to avoid the use of inserts to ensure the securing of equipment to be supported, while providing flexibility in positioning this equipment. Manufacturing times for an equipment support panel, and resulting costs, are thus reduced. In addition, the integration of the heat pipe tube within this single-piece profile section optimises the panel assembly methods.

The invention also preferably has one or more of the following optional features, taken individually or in combination.

The panel can be traversed by an easement whose routing is ensured along a recess in the profile section.

The easement can be an optical fibre held in position between the internal skin and a channel, forming a recess of the profile section, which is formed to open preferably at least at one of the first and second faces, and/or at least at one of the side faces.

The profile section may extend linearly, and the tube and the groove may extend at iso-distance along the linear length of the profile section.

In this regard, it is noted that the groove does not necessarily extend over the entire length of the tube or panel. Provision could be made of several grooves separated longitudinally by areas without grooves (also with or without continuity of the heat pipe). This would have the advantageous consequence of a larger contact surface with the internal skin of the panel, for better transfer of loads for example (in this area, the skin is then preferably not cut at the groove).

The profile section may include capillarity phase exchange elements, preferably splines formed in the internal wall of the tube.

The profile section may include at least one window for inserting the member for attaching an equipment into the groove.

The invention also relates to a satellite including a box wherein electronic equipment is boarded, this box being delimited by at least one panel according to any of the aforementioned embodiments, to ensure the support of at least one of said on-board electronic equipment.

The invention also relates to a method for manufacturing a profile section as described above, comprising a step of extruding an alloy through a die to integrally delimit the tube and the groove. As for the panel, other manufacturing techniques are possible, such as tube/groove machining, or else additive manufacturing, also called 3D manufacturing.

Finally, regardless of the design considered, it is noted that the tube forming the heat pipe is closed tightly at its two opposite ends to contain the heat-transfer fluid of the heat pipe. This closing is carried out either by adding plugs to the ends of the tube, or by providing these plugs integrated into the single-piece structure (profile section or panel), or by adopting a configuration mixing these first two solutions.

DETAILED DESCRIPTION OF PARTICULAR EMBODIMENTS

Figure 1:
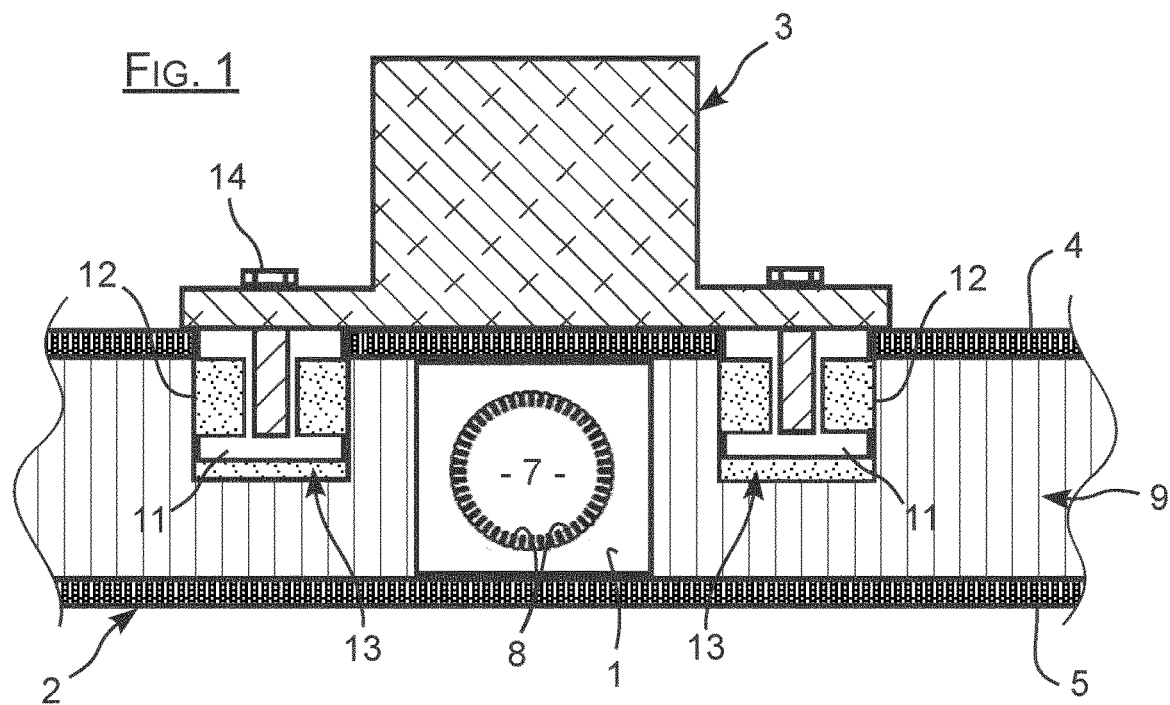
FIG. 1, already described, is a sectional view of a sandwich panel supporting electronic equipment and equipped with a heat pipe.
Figure 2:
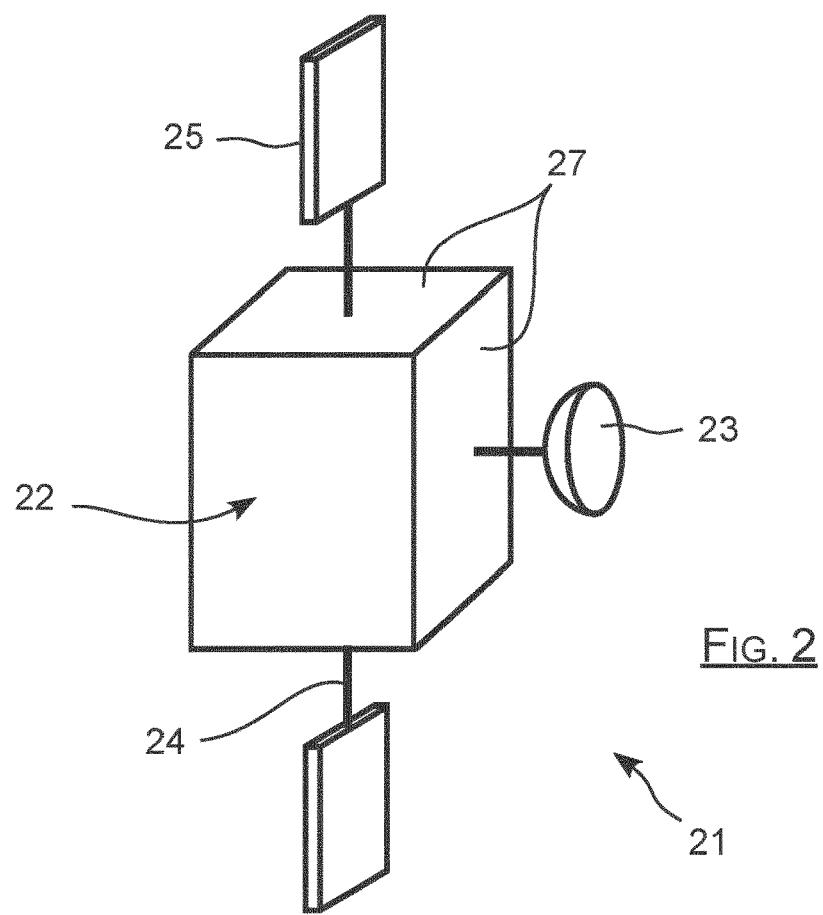
FIG. 2 is a schematic perspective view of a satellite 1 comprising a box delimited by structural panels.
Figure 3:
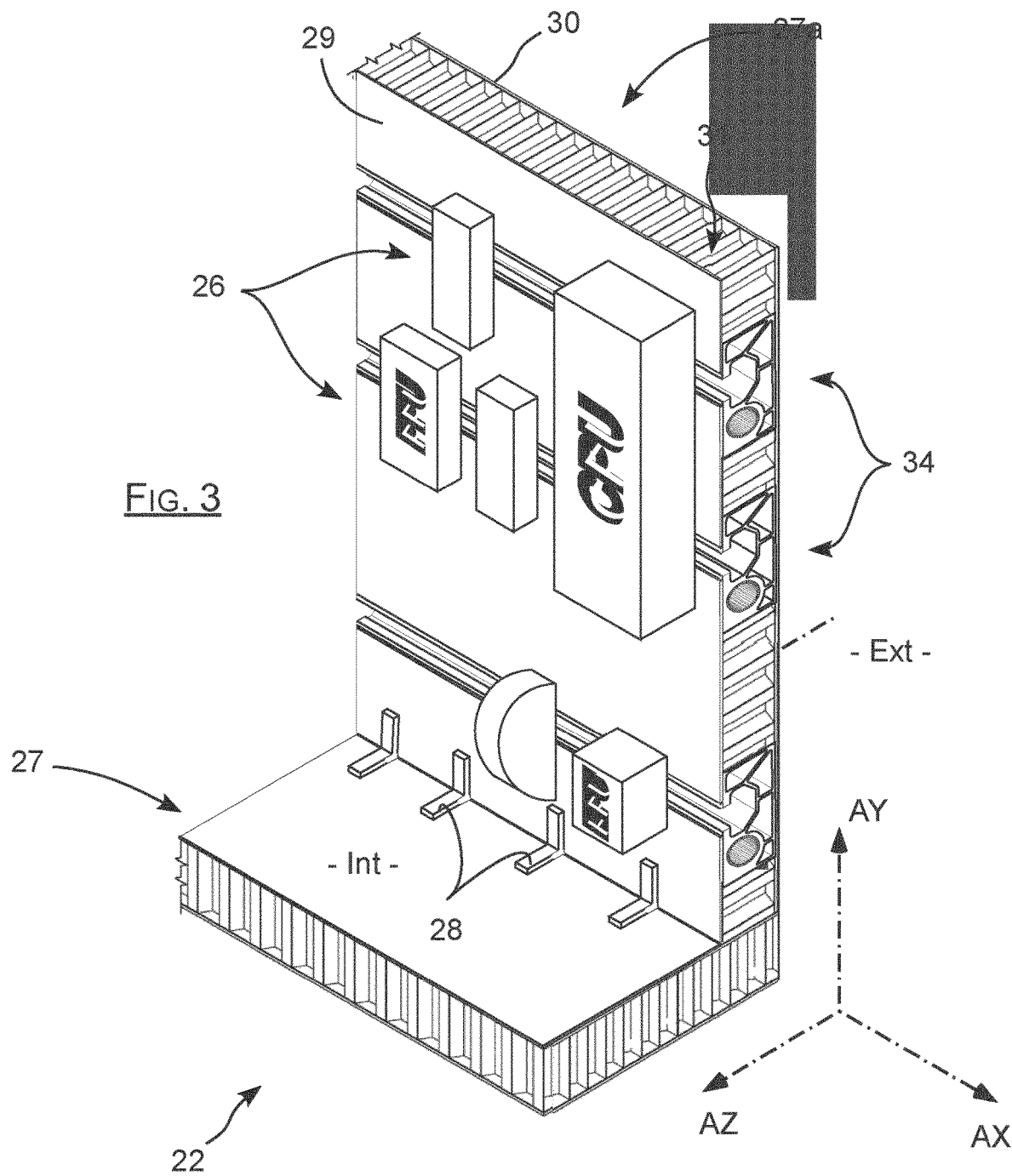
FIG. 3 illustrates a structural panel from an internal view of the box of FIG. 2, this panel including profile sections according to the invention for supporting electronic equipment and dissipating heat emitted by such equipment.

With reference to FIGS. 2 and 3, a satellite 21 of the geostationary type is shown, namely a satellite placed in geosynchronous orbit and commonly referred to as a "GEO satellite". This satellite conventionally includes a parallelepiped box 22 which supports in particular a propulsion system, not shown, one or more communication antennas 23, and arms 24 carrying solar panels 25. These solar panels allow to meet in particular the energy needs of on-board electronic equipment 26 by converting incident solar radiation into electricity.

Among the equipment mentioned, mention can be made of calculation processors "CPU", power conditioning units "PCU" which transform the electrical energy received from the solar panels into usable energy, power and distribution units providing distribution and avionic functions, power management units "PPU", propulsion control units, etc.

This electronic equipment 26, collectively designated by payload, is encapsulated in the enclosure of the box 22, denoted "int", which is isolated from the "ext" space surrounding the satellite, namely outer space in operation. More specifically, the equipment is supported by all or part of the structural panels 27 constituting the box 22, rigidly connected together by a frame or, as shown in FIG. 3, brackets 28. Other connection means can nevertheless be considered, without departing from the scope of the invention.

The panels 27 are composite in nature, each including two skins defining planes substantially parallel to each other. A skin called internal skin 29 is defined which is accessible from the enclosure of the box, and an external skin 30 accessible from outside this enclosure. An interlayer core 31 is provided between the skins to ensure their connection and, more generally, overall cohesion. This core 31 is formed in a conventional manner from the association of elements disposed regularly to form a repeatable pattern, for example a "honeycomb" pattern.

Complementary to the role of supporting the electronic equipment 26, the structural panels 27 provide both a role as a barrier to solar radiation and as a thermal regulator so as to maintain an ambient temperature admissible for the proper operation of the equipment. To satisfy this need, the structural panels 27 are coated on the external skin 30 with different layers, formed of kapton or aluminium, so as to reflect solar radiation, and they further include heat pipe type heat exchangers ensuring the role of:

thermal bridges between the panels called "hot" panels, that is to say exposed to the sun, and the panels called "cold" panels oriented in the shade, the temperature differential being able to reach 200° C.; and heat sinks, accumulated in the box, which is emitted by the electronic equipment in operation.

The idea underlying the invention is to limit any inconvenience resulting from a relocation of electronic equipment 26 which may occur post-manufacture of the panels ensuring the functions of supporting this equipment and of thermal regulator, or quite simply too late during the design phase. Another purpose is to reduce post-gluing manufacturing/machining times. Yet another purpose of the invention lies in optimising heat exchanges by bringing the heat pipe as close as possible to the equipment to be cooled, which is made possible by the coupling between the rail and the heat pipe produced within a same single-piece structure, that is to say produced integrally. In addition, as will emerge from what follows, a differentiating element of the invention lies in the possibility of lightening by using the structure of the heat pipe for a support function, thus limiting the increase in mass generated by this support function. Likewise, the rail also participates in the structural function of the sandwich panel. In this regard, the invention provides for equipping the structural panels 27 dedicated to profile sections 34 specific to the present invention, each formed integrally and which ensure a coupling of the aforementioned functions and advantages while granting relative freedom of positioning electronic equipment.

In the remainder of the description, the arrangement and morphology of the profile sections 34 will be described by considering their destination location, namely on the basis of the panel noted 27a of FIG. 3 which is equipped therewith to support a plurality of electronic equipment 26. In this example, axes AX, AY and AZ respectively define directions of length, height and thickness of the panel 27a.

The panel 27a visibly includes three profile sections 34, each in the general shape of a rectilinear bar, and each extending parallel to the axis AX. Each profile section is disposed between the two skins 29, 30 of the panel 27a, comprising a face called internal face 36 disposed in surface contact with the internal skin 29, and an opposite external face 37 which is disposed in surface contact with the external skin 30. The panel 27a is devoid of a honeycomb core at the location of a profile section 34, this profile section replacing along its length the core 31 as an interface between the two skins 29, 30 in the direction of thickness, along AZ.

Figure 4:
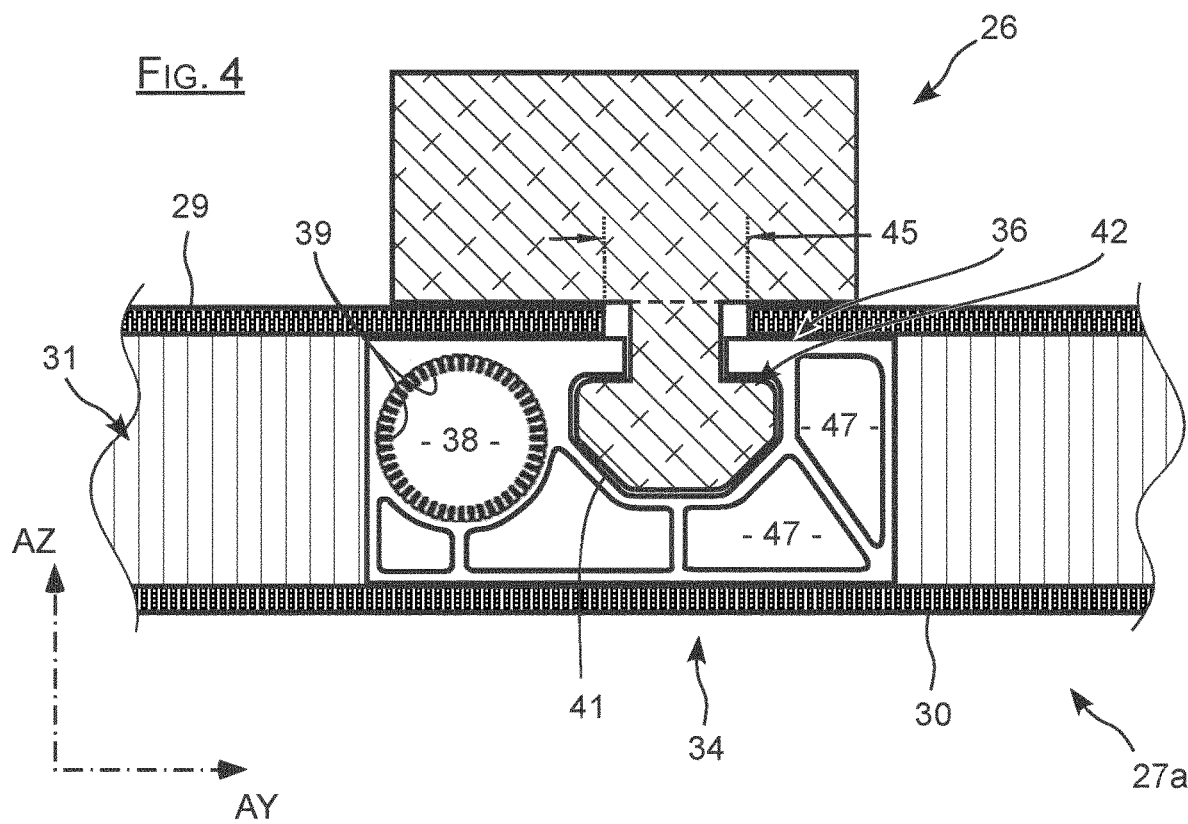
FIG. 4 is a sectional view of the panel of FIG. 3 at an electronic equipment.
Figure 5:
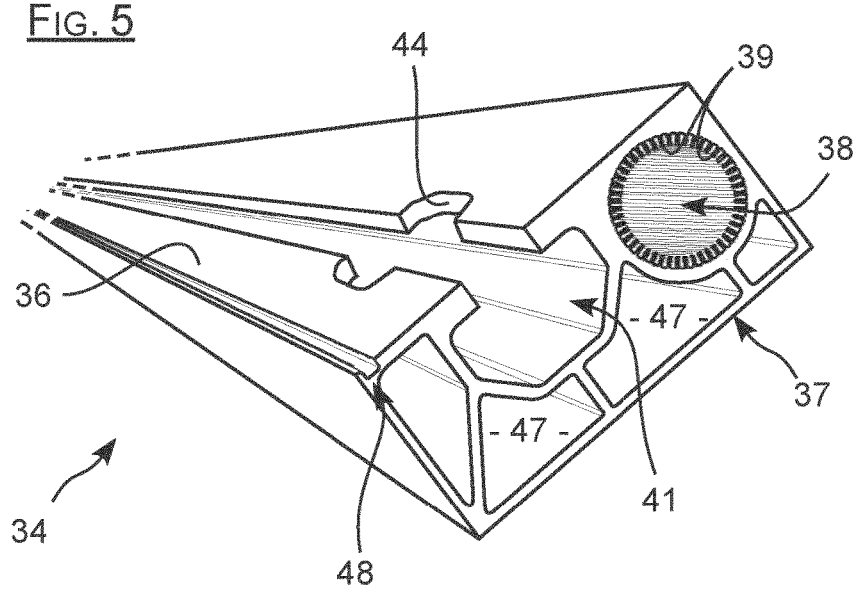
FIG. 5 is a detail and perspective view of a profile section according to the invention.

As visible in more detail in FIGS. 4 and 5, each profile section 34 delimits a tube 38. This tube, intended to form a heat pipe, is filled for this purpose with a heat-transfer fluid being provided with splines 39 which extend linearly and which protrude radially from its internal wall to ensure transport of the liquid and gas phases by capillarity. The tube 38 is plugged at each of its two ends, preferably by brazing. Plugging can occur after cleaning and when filling under pressure with the heat-transfer fluid. The plugs then become an integral part of the heat pipe, and a clearance in the honeycomb core must also be provided. Alternatively, a posteriori filling can be considered, always providing tight ends to maintain the heat-transfer fluid within the tube 38.

The tube 38 forming a heat pipe can extend over the entire length of the panel or over substantially this entire length, or even over a reduced length.

Each profile section 34 includes a groove 41 extending advantageously at iso-distance from the tube 38, and which opens at the internal face 36 of the profile section. This groove 41 is intended to provide a rail function by being dimensioned so as to be able to form-fittingly engage with an attachment member 42, for example of the "nut" type, which projects from electronic equipment 26 in order to ensure the securing to the panel 27a while allowing sliding therealong. The attachment member 42 can be rigidly connected to the equipment as schematically shown in FIG. 4, or for example a nut housed in the groove and cooperating with a screwed element also cooperating with the equipment.

With this solution, an easy modification of the location of an equipment 26 resting against the internal skin 29 by sliding along the groove 41 is made possible. The use of profile sections 34 thus introduces a notion of interchangeability, by allowing to rearrange the equipment 26 that it supports or to easily change an equipment in the event of a defect observed.

In the example of the figures, the groove 41 has in section along AX a dovetail contour, also called an "inverted T", allowing to ensure in a form-fitting manner the retention of the attachment member 42 which it receives along AZ. The blocking in position of the attachment member 42 along the groove 41 can be ensured by any known removable device or means, such as a clamp or a spring element, without departing from the scope of the invention.

The profile section 34 further includes one or more windows 44, one of which is visible in detail in FIG. 5, which are each advantageously defined at a point along the groove 41. A window 44 designates here a recess whose length in cross section, namely in a plane normal to the direction of the thickness along AZ, is at least equal to or greater than the length in measured cross section of the groove 41. As understood, it is a question of providing this window 44 of sufficiently large size to allow insertion, from the internal face 36 of the profile section, and guiding the attachment member 42 in the thickness direction AZ until it stops and engages in the groove 41. Conversely, the removal of electronic equipment 36 is carried out by sliding the attachment member 42 along the groove 41 up to a window 44. With this arrangement, it is easy to remove, move or add electronic equipment 26.

The number and arrangement of windows are not limiting factors of the invention. It is nevertheless interesting to note that several windows 44 facilitate the addition or removal of electronic equipment 36 compared to the case of a single window. Indeed, in the unitary case it is a matter of removing any electronic equipment 36 already installed as long as it constitutes an obstacle along the groove 41 by preventing access to the window 44 or to the destination location of another equipment. On the other hand, the multiplication of windows induces a reduction in the functional extent of the groove 41, namely a limitation of the spectrum of possible positions for securing equipment.

The profile sections 34 being located at the centre of the panel 27a, provision is made of slots 45 which are continuous in the internal skin 29, each superimposed along AY on the groove 41 of a corresponding profile section. These slots 45 are dimensioned so as to allow access to any window 44 from inside the box 22 and allow the equipment attachment member 42 to slide in a groove 41. In practice, each slot 45 is aligned along AZ on the groove 41 of a corresponding profile section advantageously having along AY a length slightly greater than that of the groove 41 and locally of the windows, so as to limit any friction.

As indicated previously, the profile section 34 does not necessarily extend on the entire length of the sandwich panel, and several profile sections 34 could also follow one another along the length of the panel. The groove 41 and/or the slot 45 in the internal skin do not necessarily extend over the entire length of the profile section/panel, and the skin does not necessarily have to be cut over its entire length, in particular to facilitate its handling after drilling/cutting.

The invention provides for preferential use of the method for extruding an alloy through a die, specifically adapted for the production of linear parts with a continuous section, to manufacture the profile sections 34. This manufacturing method consists in pressing an agglomerate of molten metal billets through the die. This die has a cross-sectional shape which corresponds to the negative of the desired section of the profile section 34. Machining operations are carried out after extrusion and cooling to form in particular the windows 44 allowing the future engagement of the attachment members 42 rigidly connected to electronic equipment 26.

Additive manufacturing can also be used as a substitute for extrusion, more particularly metal laser fusion or sintering on a powder bed, for integrally forming profile sections by stacking layers of powder. This method is particularly interesting in that it allows the direct formation of windows 44, namely to avoid an additional dedicated machining step for these windows 44.

Among the criteria for selecting the material used to manufacture the profile sections 34, it is particularly a question of ensuring good compatibility with the heat-transfer fluid introduced into the tubes 38 to form heat pipes. By way of non-limiting example, the profile sections 34 can be made of aluminium while ammonia is used as a heat-transfer fluid, this combination being particularly interesting in a space application with regard to the temperatures encountered. After manufacturing the profile section 34, it is a matter of forming the structural panel 27a, while ensuring that the tube 38 is filled with a heat-transfer fluid before sealing it to form a heat pipe. In the example of the figures, the profile sections 34 extend over the entire length of the panel 27a along AX. With this solution, the ends of a tube 38 are directly accessible from the edge of the panel 27a, which allows to integrate the profile section 34 between the two skins 29, 30 before hermetic sealing by closing the ends, via the use of brazed plugs, or other standard heat pipe sealing means known to the person skilled in the art. Note that the tube 38 can be sealed upstream of the assembly of the profile section 34 between the two skins 29, 30 without departing from the scope of the invention. This last design feature is particularly to be favoured if the considered profile section extends over only a portion of a panel, it being understood that the presence of a honeycomb core makes access to the ends of tube 38 difficult once installed.

The sealing of the tube 38 has been described above as relating to the direct closing of its ends. The invention is, however, not limited to this manufacturing feature, by allowing a sealing called indirect sealing. Indirect sealing means the use of any means allowing to guarantee the maintenance of the heat-transfer fluid within the tube without necessarily requiring a closing of its two ends. By way of example, the possibility of disposing several profile sections 34 in series, within the same panel 27 or at the interface between two panels 27 of the box, and of fluidly connecting the tubes so as to form jointly a heat pipe of length at least equivalent to the sum of the lengths of the tubes of the profile sections disposed end-to-end.

The assembly of the structural panel 27a of FIG. 3 may consist of gluing the external face 37 of the profile sections 34 to the external skin 30, before also gluing the external skin 30 to the honeycomb core strips 31 between these profile sections. At the same time, the internal skin 29 is cut to form the slots 45, then glued to the profile sections and the core strips 31 surrounding them, ensuring that the slots 45 are superimposed on the grooves 41. This manufacturing method does not require securing by screws, which significantly limits the number of manufacturing steps. However, a single-step gluing method is preferred.

The profile sections 34 according to the invention provide improved thermal performance, in addition to limiting the manufacturing times of the panels they equip and providing a degree of freedom in positioning the electronic equipment 26. Indeed, it should be emphasised that the single-piece nature of the profile section 34, coupled with the direct engagement in the groove 41 of the attachment member 42, induces direct contact and better efficiency in terms of heat exchange.

Concretely, the heat emitted by the equipment 26 is diffused directly towards the heat pipe, which comes from the association of the tube 38 and the heat-transfer fluid confined inside of same, passing through the attachment member 42 in contact with the profile section 34. In other words, the invention allows to limit the interfaces and the distance between the heat-emitting electronic equipment 26 and the heat pipe, bringing the cold source as close as possible to the hot source and thus increasing the efficiency of the heat pipe.

Also, the invention provides for forming recesses in the profile sections 34 so as to limit the overall mass of the panels 27, while ensuring that an admissible stiffness is maintained. Such recesses can be in the form of through chambers 47 which run along the tube 38 and the groove 41. These recesses can advantageously be used to provide an additional routing function "easements" in a panel 27. The easements can designate electrical cables in the form of harnesses, pipes carrying fluids, or any wired means allowing the transport of energy and information, for example between two pieces of equipment 26.

In the example of FIG. 5, a channel 48 is formed at the internal face 36 and wherein is disposed an optical fibre, not shown, which is held in position between the profile section 34 and the internal skin 29.

The invention was explained on the basis of the panel 27a of the appended FIG. 3, which includes three profile sections 34 which extend linearly being oriented parallel to the axis AX and are offset from each other along the axis AY. This arrangement is particularly optimised in the case where the manufacturing specifications provide information on the future integration of several batches of equipment in columns along AY and installed in cascade along AX.

As understood, this design flexibility allows to undertake the manufacture of the panel without requiring exact coordinates, in the example illustrated along AX, and thus leads to limiting production times. This aspect suggests the possibility of producing panels called standard panels 27, with pre-established profile section positions.

Concretely, the invention is not limited to the particular arrangement of FIG. 3, in particular with regard to the designation of the axis directions or else the condition of parallelism of the profile sections 34. Different orientations of profile sections 34 are permitted. In the same way, the invention is not limited to a given number of profile sections 34 fitted to a panel 27, nor to these profile sections extending in a rectilinear manner. In practice, the profile sections can have a curvature morphology without departing from the scope of the invention.

The profile sections 36 have been described as structures intended to be integrated into the centre of the panel 27, between the two skins 29, 30. However, it can be considered that the profile sections 34 are added directly onto the internal skin 29 to further reduce the assembly time, even if this configuration provides lower thermal efficiency. In such a case, direct thermal contact is observed between the electronic equipment and the internal face 36 of the profile section which it supports. Also, the panels themselves can be made in one piece and integrate the elements/functions attached to the profile sections described above.

It should be noted that a profile section may include several tubes 38 forming heat pipes in response in particular to a higher heat dissipation requirement, and/or several grooves 41 to ensure better support and greater support capacity for electronic equipment 26. With regard to the tubes 38, the existence of the splines 39 protruding from their internal wall does not appear essential, in particular if it is a question of forming heat pipes called active heat pipes, as opposed to heat pipes called passive heat pipes, namely in the case where the heat-transfer fluid is pumped within the tube using a pump and active control electronics. It is nevertheless noted that in the case of passive operation by capillarity, other elements deemed appropriate can be implemented instead of the splines 39, so as to allow the exchange of phases within the heat pipe.

Finally, the invention was described as relating to the manufacture of structural panels including profile sections 34 allowing to ensure both a thermal regulation function via heat pipe and a support function for electronic equipment in the space domain. However, the profile section according to the invention also finds its application in other fields for the manufacture of panels, of composite nature or not, intended to support all types of heat emitting equipment, such as in the fields of avionics or electronics, in order to ensure the above-mentioned functions.

What is claimed is:

1. A panel for supporting equipment, the panel comprising at least one single-piece portion made by a profile section including:
    a tube suitable for forming a heat pipe by introducing and confining a heat-transfer fluid inside of same, and
    a groove provided to form a rail along its length for securing at least one piece of equipment intended to be supported by the panel, this groove being shaped to form-fittingly engage with an attachment member rigidly connected to said at least one piece of equipment,
    said panel including two skins, respectively internal and external skins, and wherein the profile section is installed between these two skins being delimited by a first face resting against the internal skin and a second face resting against the external skin,
    the groove of the profile section being formed to open at the first face and, additionally, a slot being formed continuous in the internal skin while being superimposed on the groove to allow the support and movement of equipment resting on the internal skin by engagement and sliding of the corresponding attachment member in the groove, through the slot.

2. The panel according to claim 1, traversed by an easement whose routing is ensured along a recess in the profile section.

3. The panel according to claim 2, wherein the easement is an optical fibre held in position between the internal skin and a channel, forming a recess of the profile section, which is formed to open preferably at least at one of the first and second faces, and/or at least at one of the side faces.

4. The panel according to claim 1, the profile section extending linearly and wherein the tube and the groove extend at iso-distance along the linear length of the profile section.

5. The panel according to claim 1, the profile section including capillarity phase exchange elements, preferably splines formed in the internal wall of the tube.

6. The panel according to claim 1, the profile section including at least one window for inserting the member for attaching an equipment into the groove.

7. A satellite including a box wherein electronic equipment is boarded, this box being delimited by at least one panel according to claim 1 to ensure the support of at least one of said on-board electronic equipment.

* * * * *